United States Patent
Park et al.

(10) Patent No.: US 10,802,049 B2
(45) Date of Patent: Oct. 13, 2020

(54) CURRENT MEASUREMENT APPARATUS USING SHUNT RESISTOR

(71) Applicant: LG CHEM, LTD., Seoul (KR)

(72) Inventors: Jaedong Park, Daejeon (KR); Hyunki Cho, Daejeon (KR); Sang Hoon Lee, Daejeon (KR); Chang Hyun Sung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 119 days.

(21) Appl. No.: 16/060,287

(22) PCT Filed: May 2, 2017

(86) PCT No.: PCT/KR2017/004690
§ 371 (c)(1),
(2) Date: Jun. 7, 2018

(87) PCT Pub. No.: WO2018/021661
PCT Pub. Date: Feb. 1, 2018

(65) Prior Publication Data
US 2019/0004094 A1 Jan. 3, 2019

(30) Foreign Application Priority Data
Jul. 29, 2016 (KR) ........................ 10-2016-0097245

(51) Int. Cl.
*G01R 1/20* (2006.01)
*H01M 10/42* (2006.01)
(Continued)

(52) U.S. Cl.
CPC ............... *G01R 1/203* (2013.01); *G01R 1/20* (2013.01); *G01R 15/14* (2013.01); *G01R 19/165* (2013.01);
(Continued)

(58) Field of Classification Search
CPC .......... G01R 1/203; G01R 31/36; G01R 1/20; G01R 15/14; G01R 19/165;
(Continued)

(56) References Cited

U.S. PATENT DOCUMENTS

| 6,304,062 B1 | 10/2001 | Batson |
| 2005/0057865 A1 | 3/2005 | Veloo et al. |

(Continued)

FOREIGN PATENT DOCUMENTS

| CN | 103869140 A | 6/2014 |
| JP | 2008-47571 A | 2/2008 |

(Continued)

OTHER PUBLICATIONS

International Search Report issued in PCT/KR2017/004690 (PCT/ISA/210), dated Jul. 10, 2017.

(Continued)

*Primary Examiner* — Son T Le
(74) *Attorney, Agent, or Firm* — Birch, Stewart, Kolsach & Birch, LLP (57) ABSTRACT

The present invention relates to a current measurement apparatus using a shunt resistor, and a current measurement apparatus using a shunt resistor, in which two or more busbar-type components, to which one shunt resistor is applied, in the related art are integrated into one busbar module, and a voltage of a battery module is measured through the plurality of shunt resistors included in the one integrated busbar module, thereby decreasing volumes and price of the battery module and a battery pack, and the plurality of shunt resistors is measured through the plurality of measuring units, respectively, thereby measuring a reliable voltage value.

8 Claims, 4 Drawing Sheets

(51) Int. Cl.
  *G01R 19/165* (2006.01)
  *H01M 10/48* (2006.01)
  *G01R 15/14* (2006.01)
  *G01R 31/36* (2020.01)
  *H01M 2/20* (2006.01)
  *G01R 31/3835* (2019.01)

(52) U.S. Cl.
  CPC ......... *G01R 31/36* (2013.01); *G01R 31/3835* (2019.01); *H01M 2/206* (2013.01); *H01M 10/42* (2013.01); *H01M 10/4285* (2013.01); *H01M 10/48* (2013.01); *H01M 10/482* (2013.01)

(58) Field of Classification Search
  CPC ............ G01R 31/3835; G01R 31/3842; G01R 19/16542; G01R 15/146; G01R 31/396; H01M 2/206; H01M 2/20; H01M 10/48; H01M 10/42; H01M 10/482; H01M 10/4285
  See application file for complete search history.

(56) References Cited

U.S. PATENT DOCUMENTS

| | | |
|---|---|---|
| 2014/0159734 A1 | 6/2014 | Knill |
| 2014/0253102 A1* | 9/2014 | Wood ..................... G01R 1/203 324/140 R |
| 2014/0266269 A1* | 9/2014 | Ausserlechner ....... G01R 19/00 324/713 |
| 2017/0089955 A1* | 3/2017 | Yugou .................. G01R 31/364 |

FOREIGN PATENT DOCUMENTS

| | | |
|---|---|---|
| JP | 2009-204531 A | 9/2009 |
| JP | 2011-53095 A | 3/2011 |
| JP | 2016-3916 A | 1/2016 |
| KR | 10-2013-0137389 A | 12/2013 |
| WO | WO 2016/047010 A1 | 3/2016 |

OTHER PUBLICATIONS

European Search Report for Appl. No. 17834606.0 dated Aug. 23, 2018.

* cited by examiner

CURRENT MEASUREMENT APPARATUS USING SHUNT RESISTOR

TECHNICAL FIELD

This application claims priority to and the benefit of Korean Patent Application No. 10-2016-0097245 filed in the Korean Intellectual Property Office on Jul. 29, 2016, the entire contents of which are incorporated herein by reference.

The present invention relates to a current measurement apparatus using a shunt resistor, and particularly, to a current measurement apparatus using a shunt resistor, in which two or more bus bars including one shunt resistor are integrated into one bus bar module, and voltages applied to both ends of the plurality of shunt resistors included in the integrated bus bar are measured to calculate a voltage of a battery module.

BACKGROUND ART

A secondary battery, which has high application easiness according to a product group and an electric characteristic, such as a high energy density, has been universally applied to an electric vehicle (EV), a hybrid vehicle (HV), and the like driven by an electric driving source, or an energy storage system (ESS), an uninterruptible power supply (UPS) system, or the like using a medium and large battery used for household or industry, as well as a portable device.

The secondary battery attracts attention as a new energy source that is environmentally-friendly and has improved energy efficiency in that it is possible to innovatively decrease use of fossil energy, which is the primary advantage, while not generating a by-product when using energy.

The battery applied to the EV or the energy storage source is generally used in a form, in which a plurality of unit secondary battery cells is combined, to improve adaptiveness to a high capacity environment, which, however, is not essentially applied to a case where the secondary battery is implemented as a battery of a portable terminal and the like.

When the battery is used in the form, in which the plurality of unit secondary battery cells is combined and an operation problem, such as a flow of an overcurrent, is generated, there may be a problem in that the unit cell is expanded and damaged by overheating, so that it is necessary to consider the fact that there is a need to prevent the unit cell from being overcharged or overdischarged by always measuring and monitoring various state values of a voltage, a temperature, and the like of each individual cell.

In the related art, a voltage and a current of a secondary battery module are measured, and a shunt resistor for measuring a voltage is installed in a component included in a secondary battery module and a secondary battery pack, such as a busbar, in order to determine an overvoltage and an overvoltage state through the measured voltage and current, and a current of the battery module is calculated through the shunt resistor based on the measured voltage value to diagnose a state of the secondary battery module. However when the plurality of shunt resistors and measuring apparatuses are used in order to obtain a highly reliable measured value, the number of bus bars are increased, so that there is a problem in that a volume and price of the secondary battery module and the secondary battery pack are increased. The increase in the volume of the secondary battery module negatively influences high efficiency and high energy density of the secondary battery.

Accordingly, in order to improve efficiency and energy density of the secondary battery, compactness of the secondary battery module is essential, so that there is a need to improve reliability of a measurement of a voltage and a current of the secondary battery, and complement volume and price disadvantages of a busbar including a shunt resistor.

DETAILED DESCRIPTION OF THE INVENTION

Technical Problem

According to an exemplary embodiment of the present invention, there are provided an apparatus and a method of measuring a current, which are capable of measuring a voltage value by using an integrated busbar in order to complement volume and price disadvantages generated due to the use of the plurality of busbar-type components including a shunt resistor in the related art in order to measure a highly reliable voltage value.

Further, according to an exemplary embodiment of the present invention, there are provided an apparatus and a method of measuring a current, which are capable of decreasing volume and price of a battery module and a battery pack by measuring a voltage value by using a shunt resistor included in an integrated busbar.

Further, according to an exemplary embodiment of the present invention, there is provided an apparatus for measuring a current, which is capable of measuring a reliable voltage value by measuring each of the plurality of shunt resistors through the plurality of measuring units.

Technical Solution

According to an exemplary embodiment of the present invention, a current measurement apparatus using a shunt resistor includes: one or more busbars which connect module terminals of two battery modules included in a battery pack to each other; two or more shunt resistors, which are positioned in the busbar, and isolate the busbar into two or more regions; and one or more measuring units, which measure voltage values applied to the two or more shunt resistors, respectively, and calculate current values based on the measured voltage values.

The measuring unit may include: a voltage amplifying unit which amplifies the voltage value applied to the shunt resistor; and a current calculating unit which calculates a current value of the battery module based on the amplified voltage value.

The one or more measuring units may form one measuring module, and the measuring module may include a control unit which controls an operation of the one or more measuring units.

The apparatus may further include: a terminal shunt resistor having a through-hole in at least a partial region of the terminal shunt resistor; and a first connection terminal and a second connection terminal for measuring the voltage values applied to both ends of the terminal shunt resistor, in which the terminal shunt resistor may be installed by inserting the module terminal into the through hole with the first and second connection terminals interposed therebetween.

The terminal shunt resistor may have a washer form and the module terminal has a bolt form, and the through-hole formed inside the shunt resistor having the washer form may be screw-engaged with the module terminal having the bolt form to electrically connect the terminal shunt resistor and the module terminal.

According to another exemplary embodiment of the present invention, a current measurement apparatus using a shunt resistor includes: one or more busbars which connect module terminals of two battery modules included in a battery pack to each other; a shunt resistor which is positioned on the busbar and separates the busbar into two regions; and one or more measuring units which select at least two nodes among three or more nodes included in the shunt resistor and measure a current value of the battery module based on a voltage value applied between the selected two nodes.

The measuring unit may include: a voltage amplifying unit which amplifies the voltage value applied to the shunt resistor; and a current calculating unit which calculates a current value of the battery module based on the amplified voltage value.

The one or more measuring units may form one measuring module, and the measuring module may include a control unit which controls an operation of the one or more measuring units and selects a node for measuring the voltage value of the shunt resistor.

The apparatus may further include: a terminal shunt resistor having a through-hole in at least a partial region of the terminal shunt resistor; and a first connection terminal and a second connection terminal for measuring the voltage values applied to both ends of the terminal shunt resistor, in which the terminal shunt resistor may be installed by inserting the module terminal into the through hole with the first and second connection terminals interposed therebetween.

The terminal shunt resistor may have a washer form and the module terminal has a bolt form, and the through-hole formed inside the shunt resistor having the washer form may be screw-engaged with the module terminal having the bolt form to electrically connect the terminal shunt resistor and the module terminal.

Advantageous Effects

According to an aspect of the present invention, it is possible to provide the apparatus and the method of measuring a current, in which the plurality of busbar-type component may be integrated into one module without using the plurality of busbar-type components including a shunt resistor in the related art, in order to measure a highly reliable voltage value.

Further, according to an aspect of the present invention, it is possible to decrease volumes of a battery module and a battery pack, and decrease price by measuring the voltage of the battery module through the plurality of shunt resistors included in an integrated busbar module.

Further, according to an aspect of the present invention, it is possible to provide a current measurement apparatus using a shunt resistor, which is capable of measuring a reliable voltage value by measuring each of the plurality of shunt resistors through the plurality of measuring units even without using the plurality of busbar-type components.

MODE FOR CARRYING OUT THE INVENTION

The present invention will be described in detail below with reference to the accompanying drawings. Herein, repeated descriptions and the detailed description of a publicly known function and configuration that may make the gist of the present invention unnecessarily ambiguous will be omitted. Exemplary embodiments of the present invention are provided so as to more completely explain the present invention to those skilled in the art. Accordingly, the shape, the size, etc., of elements in the figures may be exaggerated for a clearer explanation.

Throughout the specification, unless explicitly described to the contrary, the word "include/comprise" and variations such as "includes/comprises" or "including/comprising" mean further including other constituent elements, not excluding the other constituent elements.

In addition, the term " . . . unit" described in the specification means a unit for processing at least one function and operation and may be implemented by hardware components or software components and combinations thereof.

Figure 1:
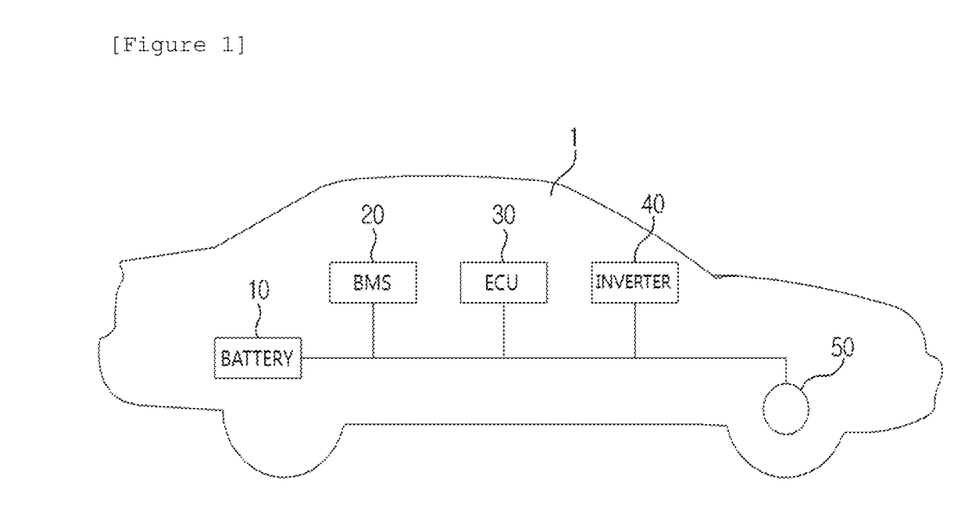
FIG. 1 is a diagram schematically illustrating an electric vehicle to which a current measurement apparatus using a shunt resistor according to an exemplary embodiment of the present invention is applicable.

FIG. 1 is a diagram schematically illustrating an electric vehicle to which a current measurement apparatus using a shunt resistor according to an exemplary embodiment of the present invention is applicable.

FIG. 1 illustrates an example, in which the current measurement apparatus using a shunt resistor according to an exemplary embodiment of the present invention is applied to an electric vehicle 1, but the current measurement apparatus using the shunt resistor according to the exemplary embodiment of the present invention is applicable to any technical field, such as an energy storage system (ESS) for home or industry or an uninterruptible power supply (UPS) system, to which a secondary battery is applicable, in addition to the electric vehicle.

The electric vehicle 1 may include a battery 10, a battery management system (BMS) 20, an electronic control unit (ECU) 30, an inverter 40, and a motor 50.

The battery 10 is an electric energy source for driving the electric vehicle 1 by providing driving force to the motor 50. The battery 10 may be charged or discharged by the inverter 40 according to the driving of the motor 50 and/or an internal combustion engine (not illustrated).

Herein, the kind of battery 10 is not particularly limited, and examples of the battery 10 may include a lithium ion battery, a lithium polymer battery, a nickel cadmium battery, a nickel hydrogen battery, a nickel zinc battery, and the like.

Further, the battery 10 is formed of a battery pack, in which a plurality of battery cells is connected in series and/or in parallel. Further, the battery 10 may include one or more battery packs.

The BMS 20 estimates a state of the battery 10, and manages the battery 10 by using information on the estimated state. For example, the BMS 20 estimates and manages state information of the battery 10, such as a state of charging (SOC), a state of health (SOH), the amount of maximum input/output allowance power, and an output voltage of the battery 10. Further, the BMS 20 controls a charge or a discharge of the battery 10 by using the state information, and further, a replacement time of the battery 10 may be estimated.

The BMS 20 may include the current measurement apparatuses 100a (see FIG. 3) and 100b (see FIG. 4) using shunt resistors according to exemplary embodiments of the present invention which are to be described below or may be operated while being connected to the current measurement apparatus using a shunt resistor. The BMS 20 may measure a charging/discharging current value of a battery by using the shunt resistors included in the current measurement apparatuses 100a and 100b using the shunt resistors, and may determine an abnormal operation state, such as low voltage and overvoltage states, of the battery 10, based on the measured charging/discharging current value of the battery 10.

The ECU 30 is an electronic control device for controlling a state of the electric vehicle 1. For example, the ECU 30 determines a torque level based on information about an accelerator, a brake, a speed, and the like, and controls an output of the motor 50 to correspond to torque information.

Further, the ECU 30 transmits a control signal to the inverter 40 so that the battery 10 is charged or discharged by the BMS 20.

The inverter 40 makes the battery 10 be charged or discharged based on a control signal of the ECU 30.

The motor 50 drives the electric vehicle 1 based on control information (for example, the torque information) transmitted from the ECU 30 by using electric energy of the battery 10.

Hereinafter, the current measurement apparatus using a shunt resistor according to an exemplary embodiment of the present invention will be described with reference to FIGS. 2 to 4.

Figure 2:
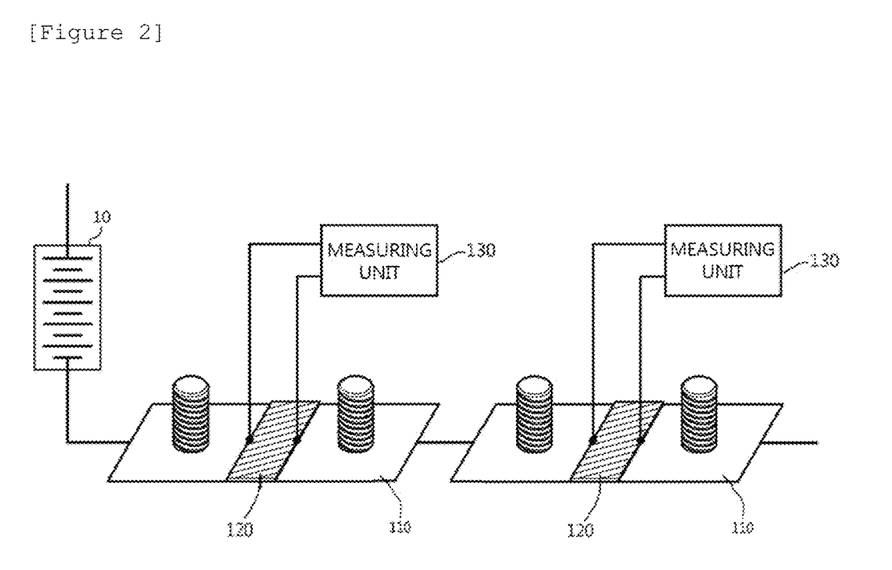
FIG. 2 is a diagram schematically illustrating the current measurement apparatus using a busbar including one shunt resistor.

FIG. 2 is a diagram schematically illustrating the current measurement apparatus using a busbar including one shunt resistor.

Referring to FIG. 2, in order to measure a current of a battery module, the current measurement apparatus calculates a current value of a battery 10 module through a measuring unit 130 based on voltage values applied to both ends of a shunt resistor 120 when a current flows in the shunt resistor 120.

As described above, when the current value of the battery module is calculated through one shunt resistor 120 and one measuring unit 130, reliability is not high, so that it is necessary to calculate a current of the battery module 10 by using the highly reliable shunt resistor 120 and measuring unit 130 or through the plurality of shunt resistors 120 and the plurality of measuring units 130. However, the current measurement apparatus has a price problem of the highly reliable shunt resistor 120 and measuring unit 130, and when the plurality of shunt resistors 120 and the plurality of measuring units 130 are used, a volume of the battery 10 module increases, thereby negatively influencing high efficiency and high energy density of the battery 10 module.

Figure 3:
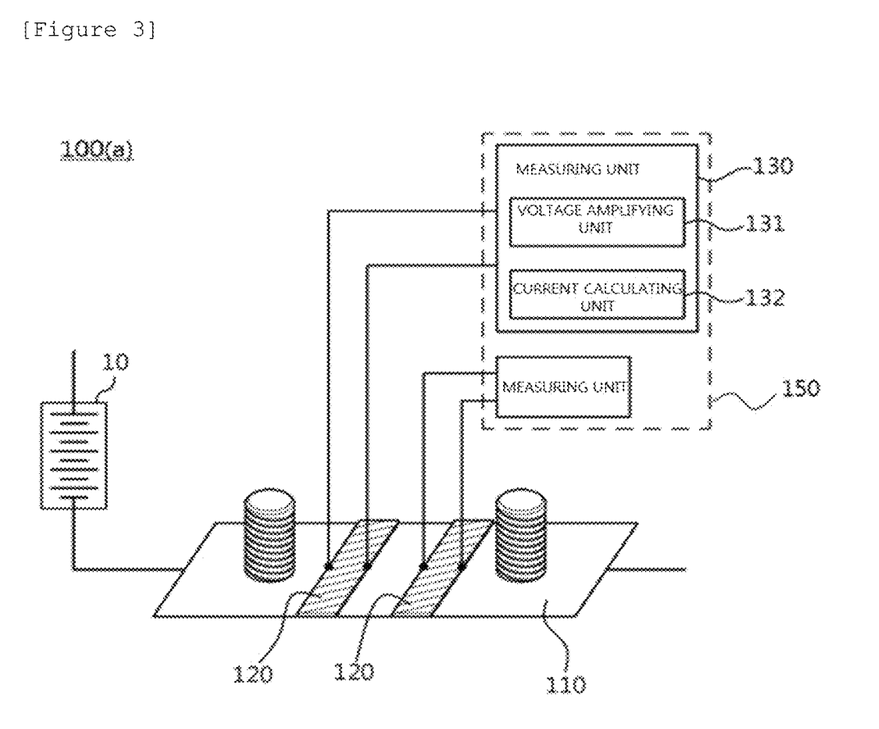
FIG. 3 is a diagram schematically illustrating the current measurement apparatus using a shunt resistor according to exemplary embodiment 1 of the present invention.

FIG. 3 is a diagram schematically illustrating the current measurement apparatus using a shunt resistor according to exemplary embodiment 1 of the present invention.

Referring to FIG. 3, the current measurement apparatus 100a using a shunt resistor may include a busbar 110, a shunt resistor 120, and a measuring unit 130.

Figure 4:
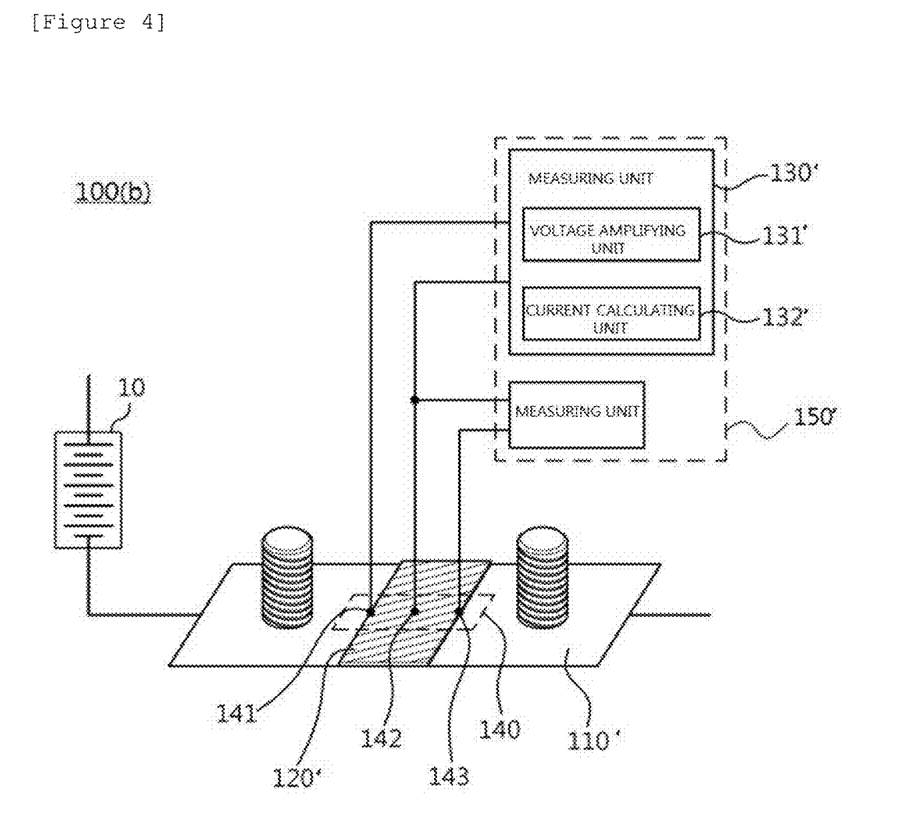
FIG. 4 is a diagram schematically illustrating the current measurement apparatus using a shunt resistor according to exemplary embodiment 2 of the present invention.

The current measurement apparatus 100a using the shunt resistor illustrated in FIG. 3 is in accordance with the exemplary embodiment, and the constituent elements of the current measurement apparatus 100a using the shunt resistor are not limited to the exemplary embodiment illustrated in FIG. 4, and may be added, changed, or deleted as necessary.

The busbar 110 may connect module terminals of two battery 10 modules included in the battery 10 pack. However, the present invention is not limited thereto, the busbar 110 may connect module terminals of two or more battery 10 modules to each other according to the number of the current measurement apparatus 100a using the shunt resistor desired to be applied. The form of the busbar 110 may also be variously formed according to a form and a disposition of the battery 10 module desired to be connected. For example, when a user desires to use the busbar, to which the current measurement apparatus 100a using the shunt resistor is applied, for connecting the module terminals of three or more battery 10 modules, it is possible to connect module terminals of three or more battery 10 modules by using one busbar 110, in which three or more busbars for connecting three or more battery 10 modules are integrated.

Further, the busbar 110 may include two or more shunt resistors 120 which are to be described below.

The shunt resistor 120 may be used for measuring a voltage of the battery 10 module, and two or more shunt resistors 120 are positioned in the busbar 110 to separate the busbar 110 into two or more regions.

Additionally, the current measurement apparatus 100a using the shunt resistor may further include a terminal shunt resistor (not illustrated).

The terminal shunt resistor (not illustrated) may include a through-hole in at least a partial region, and may be additionally installed in the module terminal of the battery 10 module, thereby increasing reliability of the measurement of the current. Herein, the through-hole may be formed to have a size or more of a diameter of the module terminal of the battery 10 module so as to allow the module terminal of the battery 10 module to be inserted.

Further, the terminal shunt resistor may include a first connection terminal (not illustrated) and a second connection terminal (not illustrated).

The first connection terminal and the second connection terminal may be installed for measuring voltage values applied to both ends of the terminal shunt resistor.

To this end, the through-hole may be included in partial regions of the first connection terminal and the second connection terminal, and the terminal shunt resistor may be installed by inserting the first connection terminal and the second connection terminal to the module terminals of the battery 10 module with the terminal shunt resistor interposed between the first connection terminal and the second connection terminal. For example, the terminal shunt resistor, the first connection terminal, and the second connection terminal may be formed in a form of a washer, and the module terminals of the battery 10 module may be formed in a form of a bolt. The terminal shunt resistor, the first connection terminal, and the second connection terminal, which are formed in the form of the washer may be screw-engaged with the module terminal having the bolt form through the through-holes formed inside thereof and may be electrically connected.

Further, the first connection terminal, the terminal shunt resistor, and the second connection terminal may be manufactured in a coupled form. For example, the first connection terminal, the second connection terminal, and the terminal shunt resistor may be formed in a form of one washer.

The measuring unit 130 may measure a voltage value applied to each of the two or more shunt resistors 120, and calculate each of a current value based on the measured voltage value.

To this end, one or more measuring units 130 may be included. Further, the measuring unit 130 may include a voltage amplifying unit 131 and a current calculating unit 132.

The voltage amplifying unit 131 may serve to amplify a voltage value of the battery 10 module applied to the shunt resistor 120. In general, resistance having a very small value is used as a resistance value of the shunt resistor in order to minimize an influence on a load. For example, a resistance value of the shunt resistor 120 may be 100 μΩ. Accordingly, the voltage value of the battery 10 module applied to the shunt resistor 120 is very small, so that it is necessary to amplify the voltage value of the battery 10 module.

Accordingly, the voltage amplifying unit 131 may amplify the small voltage value applied to the shunt resistor. For example, the voltage amplifying unit 131 may be a circuit in which one or more operating amplifiers are connected in series and in parallel, and may amplify voltage values applied to both ends of the shunt resistor 120 based on a gain value predetermined in the operating amplifier.

The current calculating unit 132 may calculate a current of the battery 10 module based on the voltage values applied to both ends of the shunt resistor 120 amplified through the voltage amplifying unit 131. For example, when a current flows in the shunt resistor 170 of 100 μΩ, a potential difference of 1 mV is generated by the Ohms law (V=I×R), and the generated potential difference is amplified by a multiplication of the gain value predetermined in the voltage amplifier 131 to be output. In contrast, in the case where an output voltage is 4.5 V, when the output voltage is divided by the predetermined gain value, it can be seen that a potential difference of 0.045 V is generated, and a current of 450 A flows by the Ohms law (V=I×R).

In order to measure each of the plurality of shunt resistors 120, the current measurement apparatus may include one or more measuring units 130, and the one or more measuring units 130 may configure one measuring module 150.

The measuring module 150 may be formed of one or more measuring units 130, and may include a control unit (not illustrated) controlling an operation of the one or more measuring units 130.

The control unit may control an operation of the one or more measuring units to be on or off. The control unit may turn off an operation of a measuring unit having a problem. Further, when high reliability is not required, the control unit may selectively operate and use only some measuring units among the plurality of measuring units. For example, the one or more measuring units 130 may be connected with switches (not illustrated), respectively, and the control unit may control the operation of the measuring unit 130 by controlling on or off of the switch connected with the measuring unit 130.

FIG. 4 is a diagram schematically illustrating the current measurement apparatus using a shunt resistor according to exemplary embodiment 2 of the present invention.

Referring to FIG. 4, the current measurement apparatus 100b using a shunt resistor may include a busbar 110', a shunt resistor 120', and a measuring unit 130', like the current measurement apparatus 100a using the shunt resistor.

The busbar 110' may connect module terminals of two battery 10 modules included in a battery 10 pack, identically to the busbar 110 in exemplary embodiment 1. The busbar 110' may connect the module terminals of the two or more battery 10 modules to each other according to the number of the current measurement apparatus 100b using the shunt resistor desired to be applied. The form of busbar 110 may also be variously formed according to a form and a disposition of the battery 10 module desired to be connected.

The shunt resistor 120' may be used for measuring a voltage of the battery 10 module. Further, the shunt resistor 120' may be positioned on the busbar 110' to separate the busbar 110' into two regions. However, the present invention is not limited thereto, and one or more shunt resistors 120' may be positioned on the busbar 110' according to a demand and a use environment of a user, and may separate the busbar 120' into two or more regions.

The shunt resistor 120 may be used for measuring a voltage of the battery 10 module, and two or more shunt resistors 120 are positioned in the busbar 110 to separate the busbar 110 into two or more regions.

Additionally, the current measurement apparatus 100b using the shunt resistor may further include a terminal shunt resistor (not illustrated).

The terminal shunt resistor (not illustrated) may include a through-hole having a size of a diameter of the module terminal in at least a partial region, and may be additionally installed in the module terminal of the battery 10 module, thereby increasing reliability of the measurement of the current. To this end, the terminal shunt resistor may include a first connection terminal (not illustrated) and a second connection terminal (not illustrated).

The first connection terminal and the second connection terminal may be installed for measuring voltage values applied to both ends of the terminal shunt resistor.

To this end, the through-hole may be included in partial regions of the first connection terminal and the second connection terminal, and the terminal shunt resistor may be installed by inserting the first connection terminal and the second connection terminal to the module terminals of the battery 10 module with the terminal shunt resistor interposed between the first connection terminal and the second connection terminal. For example, the terminal shunt resistor, the first connection terminal, and the second connection terminal may be formed in a washer form like exemplary embodiment 1. Further, the first connection terminal, the terminal shunt resistor, and the second connection terminal may be manufactured in a coupled form.

Further, the shunt resistor 120' may include a node part 140 which is to be described below.

The node part 140 is a contact point for measuring a voltage value of the shunt resistor 120', and may include three or more nodes 141, 142, and 143 within the shunt resistor.

The positions and the number of nodes 141, 142, and 143 may be determined according to the kind and a size of the shunt resistor 120', the number of measuring units 130', and a demand of a user.

One or more measuring units 130' may be included, and the measuring node 130' may select at least two nodes among three or more nodes 141, 142, and 143 included in the shunt resistor 120'. The measuring unit 130' may measure a current value of a battery module based on a voltage value applied between the selected nodes.

Further, the measuring unit 130' may include a voltage amplifying unit 131' and a current calculating unit 132', similar to the measuring unit 130 in exemplary embodiment 1.

Herein, functions and principles of the voltage amplifying unit 131' and the current calculating unit 132' may be identically applied to those of the voltage amplifying unit 131 and the current calculating unit 132 in exemplary embodiment 1.

One or more measuring units 130' may be included for measuring each voltage value among the nodes 141, 142, and 143 included in the shunt resistor 120'. One or more measuring units 130' may form one measuring module 150'.

The measuring module' 150 may include one or more measuring units' 130, and may include a control unit (not illustrated) controlling an operation of the one or more measuring units 130'.

The control unit may control on or off of an operation of the one or more measuring units, thereby turning off an operation of the measuring unit having a problem. Further, when high reliability is not required, the control unit may selectively operate only some measuring units among the plurality of measuring units. In additionally, the control unit may select at least two nodes among three or more nodes 141, 142, and 143 included in the shunt resistor 120'. For example, the nodes 141, 142, and 143 may have various combinations, such as a combination of the node 141 and the node 142, a combination of the node 141 and the node 143, and a combination of the node 142 and the node 143, and a switch (not illustrated) may be connected in each combination. The control unit controls the switches connected between the combined nodes 141, 142, and 143, thereby selecting the combination of at least two nodes.

In the forgoing, the specific exemplary embodiment of the present invention has been illustrated and described, but it is apparent to those skilled in the art that the technical spirit of the present invention is not limited by the accompanying drawings and the described contents, and may be modified in various forms without departing from the spirit of the present invention, and the modifications are considered to belong to the claims of the present invention without departing from the spirit of the present invention.

The invention claimed is:

1. A current measurement apparatus using a shunt resistor, the apparatus comprising:
one or more busbars which connect module terminals of two battery modules included in a battery pack to each other;
two or more shunt resistors, which are positioned in the busbar, and isolate the busbar into two or more regions; and
one or more measuring calculators, which measure voltage values applied to the two or more shunt resistors, respectively, and calculate current values based on the measured voltage values,
wherein the measuring calculators each includes:
a voltage amplifying circuit which amplifies the voltage value applied to the shunt resistor; and
a current calculating circuit which calculates a current value of the battery module based on the amplified voltage value,
wherein the two or more shunt resistors have the same resistance,
wherein the one or more measuring calculators form one measuring circuit, and
wherein the measuring circuit includes a control circuit which controls an operation of the one or more measuring calculators to turn off.

2. The apparatus of claim 1, further comprising:
a terminal shunt resistor having a through-hole in at least a partial region of the terminal shunt resistor; and
a first connection terminal and a second connection terminal for measuring the voltage values applied to both ends of the terminal shunt resistor,
wherein the terminal shunt resistor is installed by inserting a module terminal among the module terminals into the through hole with the first and second connection terminals interposed therebetween.

3. The apparatus of claim 2, wherein the terminal shunt resistor has a washer form and the module terminal has a bolt form, and
the through-hole formed inside the shunt resistor having the washer form is screw-engaged with the module terminal having the bolt form to electrically connect the terminal shunt resistor and the module terminal.

4. The apparatus of claim 1, wherein the control circuit of the measuring circuit selectively operates and use only some measuring calculators among the one or more measuring calculators based on reliability of the measured voltage values.

5. A current measurement apparatus using a shunt resistor, the apparatus comprising:
one or more busbars which connect module terminals of two battery modules included in a battery pack to each other;
a shunt resistor which is positioned on the busbar and separates the busbar into two regions; and
one or more measuring calculators which select at least two nodes among three or more nodes included in the shunt resistor and measure a current value of the battery module based on a voltage value applied between the selected two nodes,
wherein the measuring calculators each includes:
a voltage amplifying circuit which amplifies the voltage value applied to the shunt resistor; and
a current calculating circuit which calculates a current value of the battery module based on the amplified voltage value,
wherein the two or more shunt resistors have the same resistance,
wherein the one or more measuring calculators form one measuring circuit, and
wherein the measuring circuit includes a control circuit which controls an operation of the one or more measuring calculators to turn off, and selects a node for measuring the voltage value of the shunt resistor.

6. The apparatus of claim 5, further comprising:
a terminal shunt resistor having a through-hole in at least a partial region of the terminal shunt resistor; and
a first connection terminal and a second connection terminal for measuring the voltage values applied to both ends of the terminal shunt resistor,
wherein the terminal shunt resistor is installed by inserting a module terminal among the module terminals into the through hole with the first and second connection terminals interposed therebetween.

7. The apparatus of claim 6, wherein the terminal shunt resistor has a washer form and the module terminal has a bolt form, and
the through-hole formed inside the shunt resistor having the washer form is screw-engaged with the module terminal having the bolt form to electrically connect the terminal shunt resistor and the module terminal.

8. The apparatus of claim 5, wherein the control circuit of the measuring circuit selectively operates and use only some measuring calculators among the one or more measuring calculators based on reliability of the measured voltage values.

* * * * *